(12) United States Patent
Oshima

(10) Patent No.: US 6,323,684 B1
(45) Date of Patent: Nov. 27, 2001

(54) VOLTAGE TOLERANT INTERFACE CIRCUIT

(75) Inventor: Masayuki Oshima, Sunnyvale, CA (US)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/676,378

(22) Filed: Sep. 29, 2000

Related U.S. Application Data

(62) Division of application No. 09/336,465, filed on Jun. 18, 1999, now Pat. No. 6,144,221.
(60) Provisional application No. 60/091,577, filed on Jul. 2, 1998.

(51) Int. Cl.[7] .............................. H03K 19/0175
(52) U.S. Cl. ................ 326/81; 326/86; 326/57; 327/535
(58) Field of Search ............... 326/80, 81, 56–58, 326/83, 86; 327/534, 535

(56) References Cited

U.S. PATENT DOCUMENTS

| 4,963,766 | 10/1990 | Lundberg . |
| 5,144,165 | 9/1992 | Dhong et al. . |
| 5,151,619 | 9/1992 | Austin et al. . |
| 5,451,889 | * 9/1995 | Heim et al. ............... 326/81 |
| 5,467,031 | * 11/1995 | Nguyen et al. ............ 326/81 |
| 5,512,844 | 4/1996 | Nakakura et al. . |
| 5,546,020 | 8/1996 | Lee et al. . |
| 5,576,635 | 11/1996 | Partovi et al. . |
| 5,721,508 | 2/1998 | Rees . |
| 5,748,011 | * 5/1998 | Takahashi et al. ......... 326/83 |
| 5,825,206 | * 10/1998 | Kirshnamurthy et al. ... 326/81 |
| 6,084,431 | * 7/2000 | Shigehara et al. ......... 326/81 |

FOREIGN PATENT DOCUMENTS

| 3-116316 | 5/1991 | (JP) . |
| 7-79232 | 8/1995 | (JP) . |
| 7-118644 | 12/1995 | (JP) . |
| 8-8715 | 1/1996 | (JP) . |
| 8-32434 | 2/1996 | (JP) . |
| 2547491 | 8/1996 | (JP) . |

* cited by examiner

*Primary Examiner*—Michael Tokar
*Assistant Examiner*—Don Phu Le

(57) ABSTRACT

An interface circuit functions as a so-called voltage tolerant circuit to which signals may be applied from, for example, a 3.3-V internal source or from an external source operating with a supply voltage greater than the internal source, for example, a 5-V source. By eliminating a floating voltage state in the internal circuits, problem-causing current leaks can be prevented in substantially all operating modes, that is, in any signal input or output mode, and in any voltage transition state, that is, irrespective of the sequence in which, for example, 0-V, 3.3-V, and 5-V signals are applied.

9 Claims, 5 Drawing Sheets

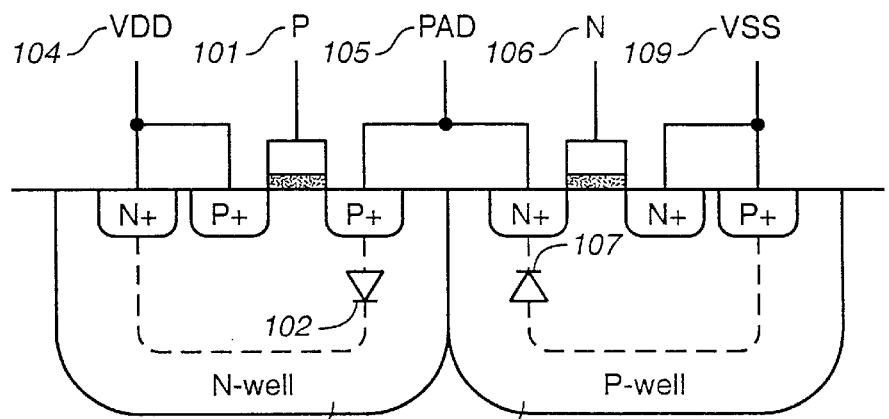
FIG._1a
(PRIOR ART)
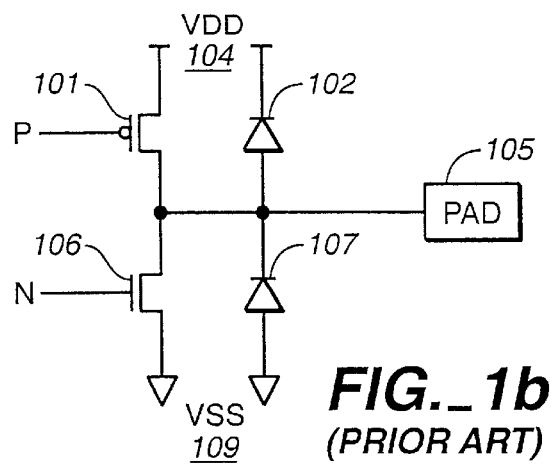
FIG._1b
(PRIOR ART)
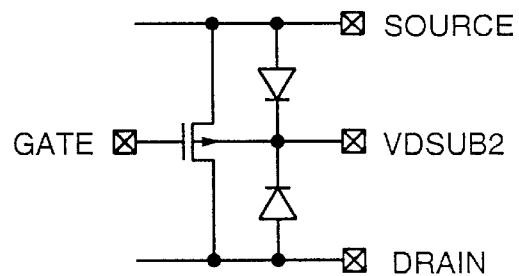
FIG._3

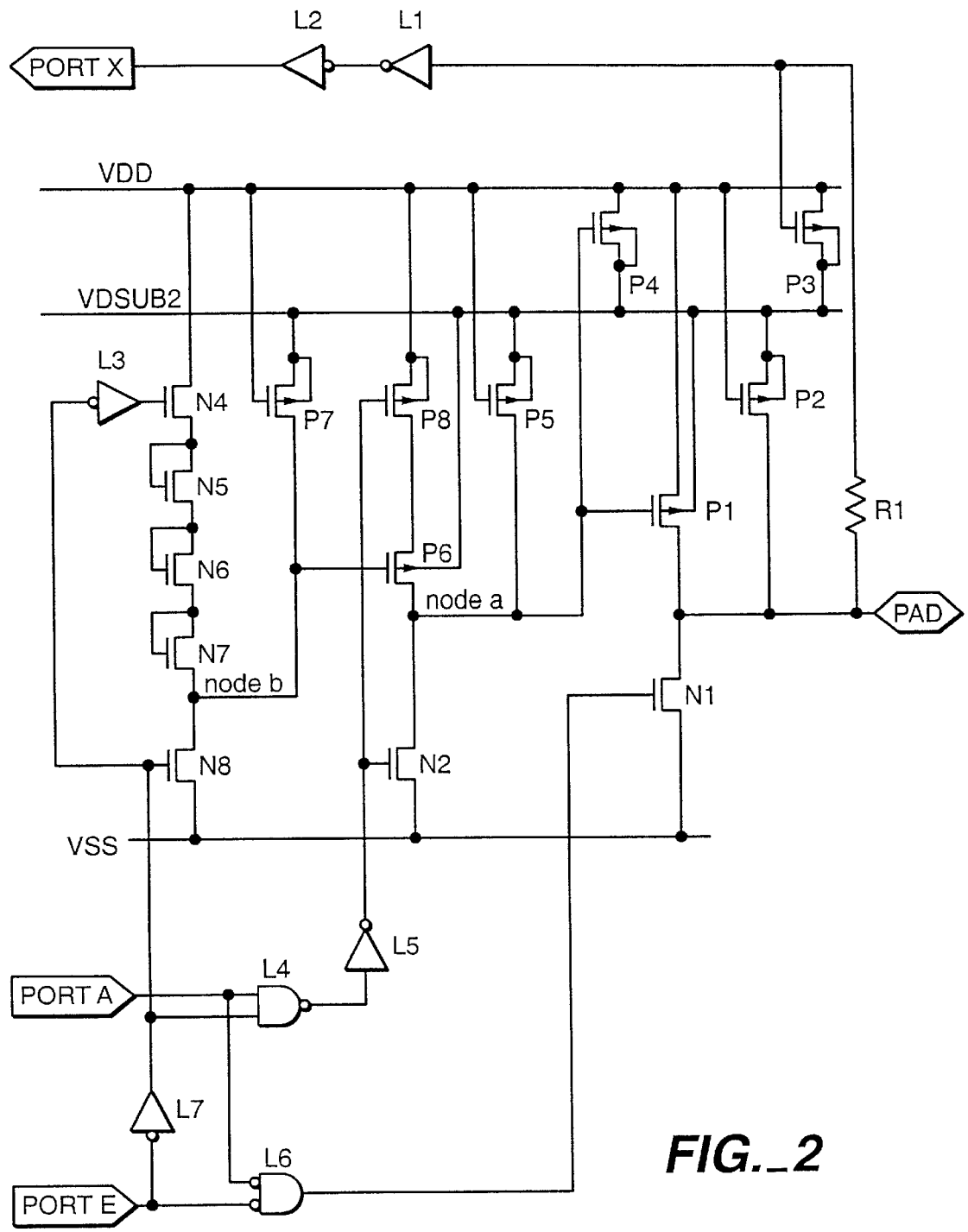
FIG._2

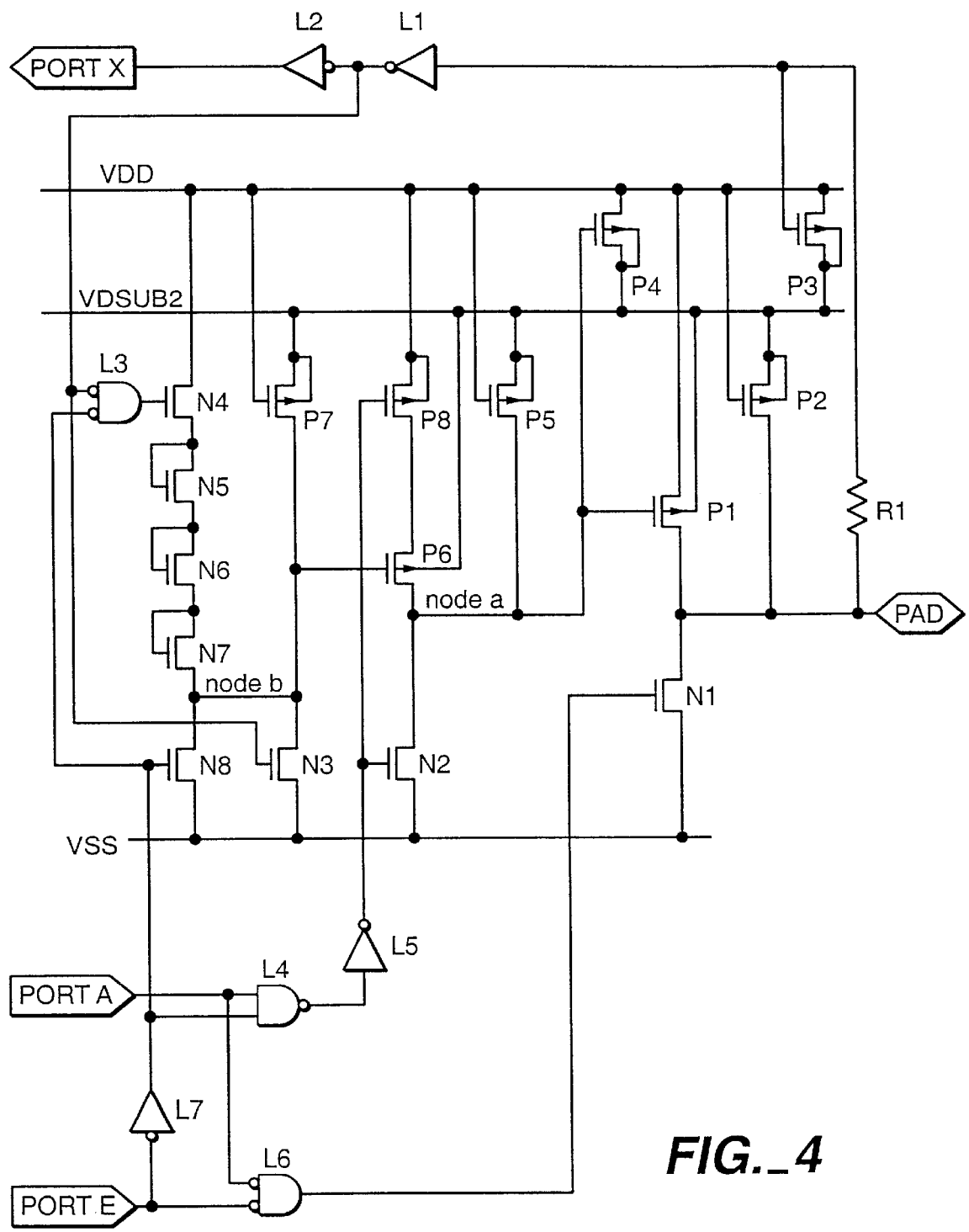
FIG._4

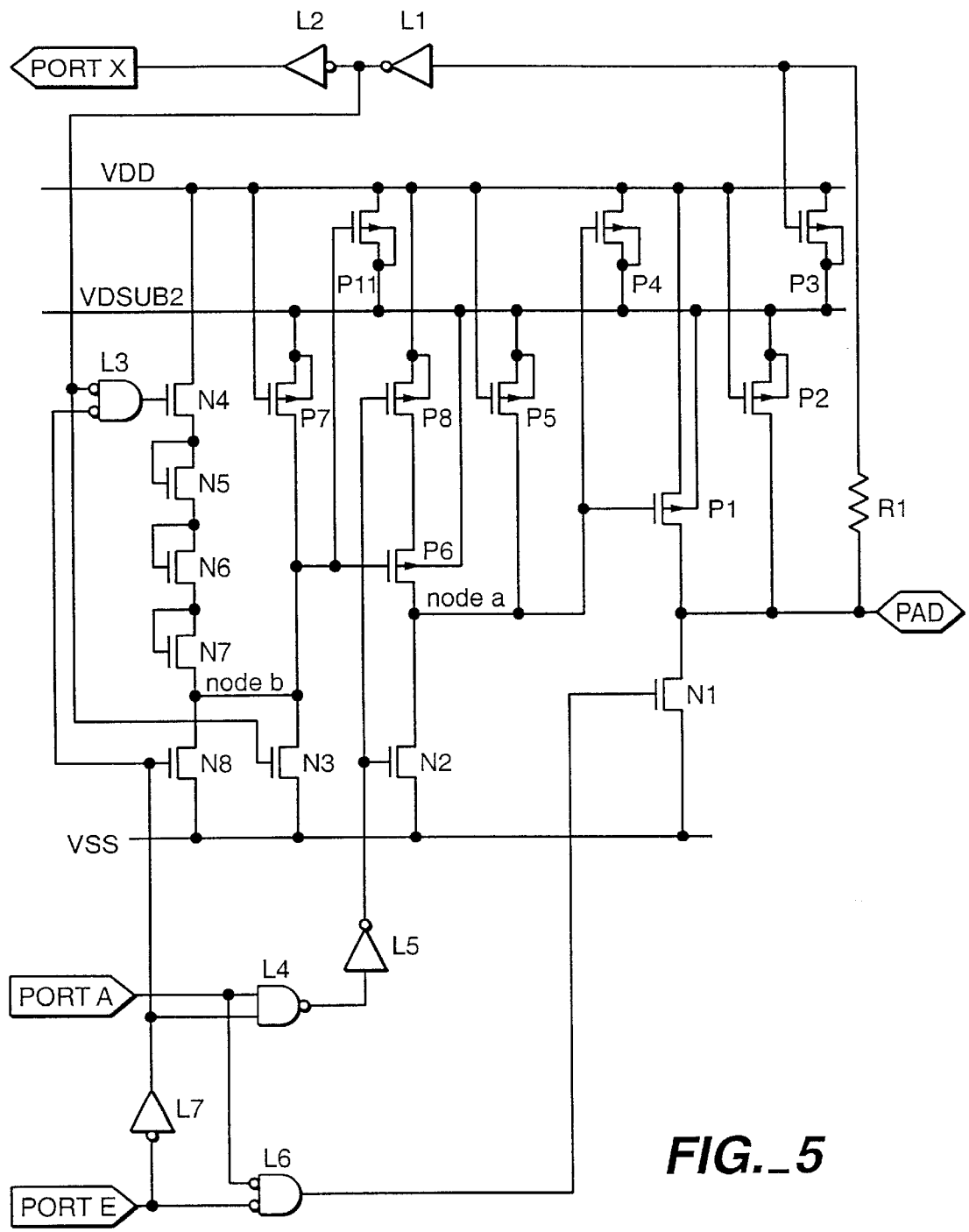
FIG._5

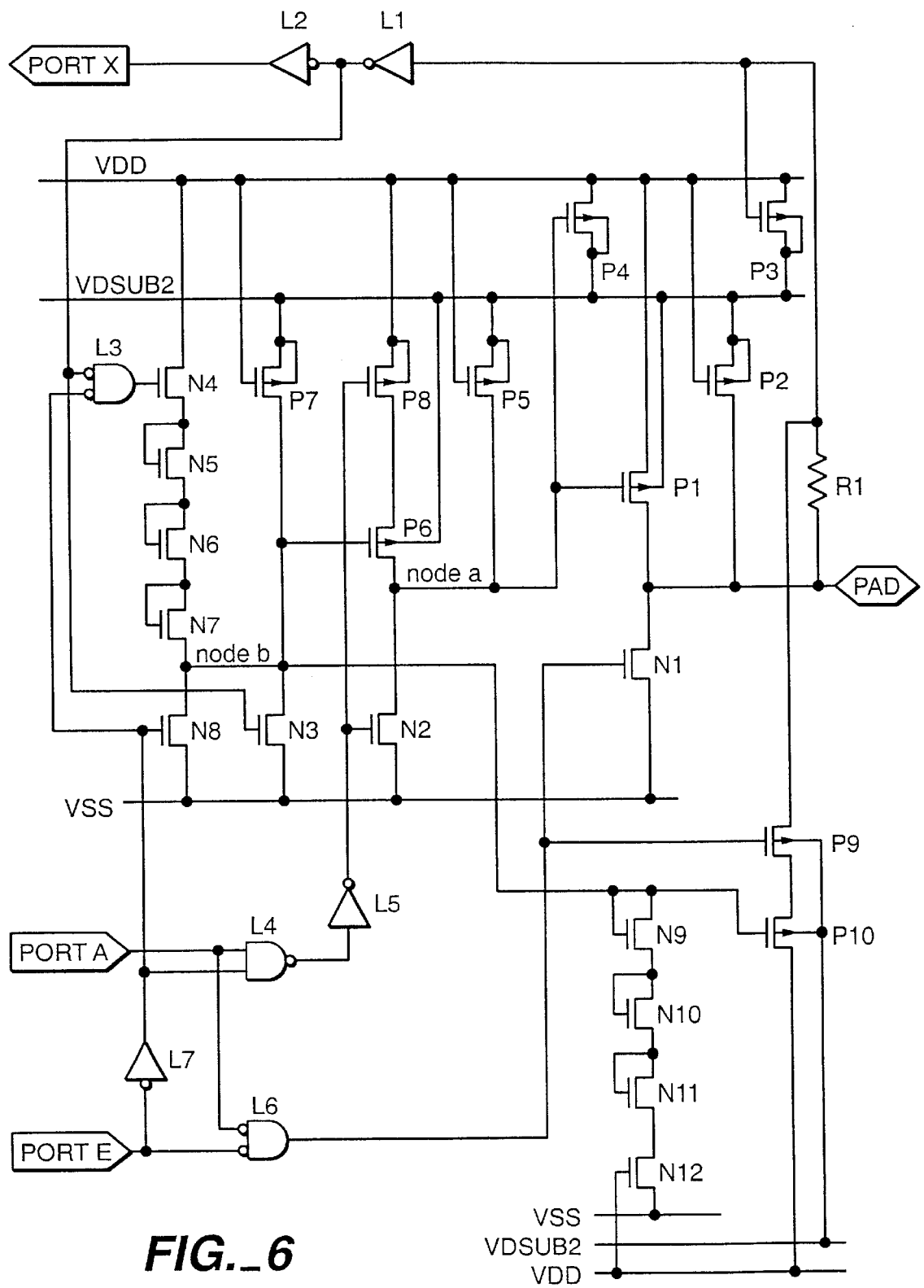
FIG._6

VOLTAGE TOLERANT INTERFACE CIRCUIT

CROSS-REFERENCE TO RELATED APPLICATIONS

This application is a divisional of co-pending application Ser. No. 09/336,465 filed on Jun. 18, 1999 now U.S. Pat. No. 6,144,221, which is incorporated by reference herein in its entirety. This application claims the benefit of the earlier filing date under 35 U.S.C. 119(e) of U.S. Provisional Application No. 60/091,577, filed Jul. 2, 1998, which application is incorporated herein by reference in its entirety.

BACKGROUND OF THE INVENTION

1. Field of the Invention

The present invention relates to a semiconductor interface circuit, and relates more specifically to an input/output circuit, commonly known as a voltage tolerant circuit, to which a voltage potential that is different from and higher than the potential of the internal power supply can be applied.

2. Description of the Related Art

Semiconductor integrated circuit (IC) technologies have developed in recent years to the point where a complete system can be manufactured in a single IC device. These single-chip system ICs typically have a transistor count exceeding several million gates with more than 500 pins for IC mounting, and combine logic, memory, CPU, analog cell, and other components that heretofore were provided on separate chips.

Semiconductor process technologies have also developed from so-called submicron level processes with line widths on the order of 0.8 μm and 0.65 μm, to so-called deep submicron level processes with line widths of 0.35 μm and 0.25 μm in response to demand for higher integration, speed, and lower power consumption. Numerous manufacturers are also currently developing processes achieving line widths of 0.18 μm, 0.15 μm and 0.13 μm.

As process resolution has thus increased and line widths have decreased, gate insulator film thickness has also decreased. This enables IC devices to operate at higher clock rates, but has also lowered the voltage strength of the gate insulator film. More specifically, it is not possible to assure product quality at the 5-V supply voltage that is common with typical conventional ICs. Furthermore, because lowering the supply voltage is the most effective method of lowering power consumption, the typical IC supply voltage has been reduced from 5 V with submicron process devices to 3.3 V with deep submicron process devices.

This has made it necessary to use an interface capable of handling both 5 V and 3.3 V because not all peripheral components have been changed to operate at 3.3 V. Consider, for example, a PCI card or SCSI card for personal computer use.

While the IC itself operates at only 3.3 V, other cards connected to the bus to which the PCI card or SCSI card is connected may operate at 3.3 V or 5 V. This requires an interface circuit that prevents problems from occurring whether a 3.3 V or 5 V signal is applied to an IC operating at 3.3 V.

Further, operation at 3.3 V cannot be assured with 0.25 μm process devices, and the operating voltage must be further lowered to 2.5 V, 2 V, or even lower.

Some of the problems that can occur when 5 V is applied to a 3.3-V IC in a conventional input/output interface circuit are described next with reference to FIG. 1a and 1b.

FIG. 1a is a section view of the driver part of an input/output (I/O) circuit, and FIG. 1b is an equivalent circuit diagram. A diode 102 is formed between the N-well 103 substrate and the drain of p-channel transistor 101 formed above the N-well 103. A diode 107 is likewise formed between the P-well 108 substrate and n-channel transistor 106 formed above the P-well 108. These diodes 102 and 107 are inevitably formed as a parasitic diode by-product of this transistor design; it is not possible to build the transistors without also forming these diodes 102 and 107.

The source of p-channel transistor 101 and N-well 103 are connected to power source VDD 104, and the source of n-channel transistor 106 and P-well 108 are connected to ground source VSS 109. As a result, diode 102 is formed between pad 105 and VDD 104, and diode 107 is formed between pad 105 and VSS 109. An equivalent circuit is shown in FIG. 1b.

When the I/O circuit is in an input mode, the gate of p-channel transistor 101 is driven to the VDD potential and the gate of n-channel transistor 106 to the VSS potential, thereby turning the transistors off. This prevents shorting the signal applied to the pad 105. However, when a signal exceeding VDD is applied to the pad 105, the pad 105 and VDD are shorted through the diode 102. That is, when 5 V is applied to a 3.3-V IC, the 5 V signal shorts the 3.3 V supply, resulting in IC operating errors and, in the worst case, in total IC failure.

A pull-up resistor between the pad and VDD and connected to the p-channel transistor results in the same problem. That is, various functional circuits of various types are connected to the same bus, and a pull-down or pull-up resistor must be provided to prevent bus floating. However, in a tolerant circuit, that is, a circuit to which an input may be applied from an external power source that is higher than the internal supply of the circuit, a pull-up resistor cannot be provided for the above-noted reason, and only circuits using a pull-down resistor have been achievable.

To resolve primarily the above-noted current leakage problem, U.S. Pat. No. 5,151,619 (Japan Examined Patent Application Publication (kokoku) H7-118644), U.S. Pat. No. 4,782,250 (kokoku H7-79232), and U.S. Pat. No. 5,721,508 teach a design in which a number of p-channel transistors in the I/O circuit are formed in a floating N-well; U.S. Pat. No. 5,144,165 (Japanese Patent No. 2547491, and U.S. Pat. No. 4,963,766 (Japan Unexamined Patent Application Publication (kokai) H3-116316) teach a design having a number of p-channel transistors forming the I/O circuit (transmission gate circuit) formed on a N-well connected to a 5-V source; and U.S. Pat. No. 5,512,844 (kokai H8-32434), U.S. Pat. No. 5,546,020 (kokai H8-8715), and U.S. Pat. No. 5,576,635 teach a design using a passgate circuit for preventing current leaks.

A problem that the related art does not resolve, however, is the current leaks that cannot be prevented under all conceivable input states and output states, that is, under all possible voltage transition states that might occur during signal input and output, in a so-called voltage tolerant interface circuit intending to accommodate inputs from both an internal source and a voltage source higher than the internal voltage source of the voltage tolerant circuit.

A further problem unresolved by the related art is the inability to achieve a voltage tolerant interface circuit having a pull-up resistance formed with a p-channel transistor.

OBJECTS OF THE INVENTION

It is therefore an object of the present invention to provide a so-called voltage tolerant interface circuit for accommodating inputs from an internal source and a voltage source higher than the internal voltage source of the voltage tolerant circuit. More specifically, the present invention provides a high quality, high added value interface circuit capable of preventing problem-causing current leaks under substantially all input states and output states, that is, under all possible voltage transition states that might occur during signal input and output.

A further object of the present invention is to provide such a high quality, high added value voltage tolerant interface circuit having a pull-up resistance circuit, and being capable of preventing problem-causing current leaks under all input states and output states, that is, under all possible voltage transition states that might occur during signal input and output.

SUMMARY OF THE INVENTION

An interface circuit according to the present invention is a so-called voltage tolerant circuit to which signals may be applied from, for example, a 3.3-V internal source or from an external source operating with a supply voltage greater than the internal source, for example, a 5-V source. By eliminating a floating voltage state in the internal circuits, problem-causing current leaks can be prevented in substantially all operating modes, that is, in any signal input or output mode, and in any voltage transition state, that is, irrespective of the sequence in which, for example, 0-V, 3.3-V, and 5-V signals are applied.

Other objects and attainments together with a fuller understanding of the invention will become apparent and appreciated by referring to the following description and claims taken in conjunction with the accompanying drawings.

BRIEF DESCRIPTION OF THE DRAWINGS

In the drawings, wherein like reference symbols refer to like parts:

FIG. 1a is a section view of the driver part of an input/output circuit;

FIG. 1b is an equivalent circuit diagram for the driver part shown in FIG. 1a;

FIG. 2 depicts an interface circuit used to describe the present invention;

FIG. 3 depicts a p-channel transistor formed on a floating N-well;

FIG. 4 depicts an interface circuit achieving better current leakage prevention compared with the interface circuit shown in FIG. 2;

FIG. 5 depicts an interface circuit modified from that shown in FIG. 4 by the addition of one transistor to eliminate the VDSUB2 floating state that occurs under certain conditions in the interface circuit shown in FIG. 4; and FIG. 6 depicts an interface circuit comprising an I/O circuit having a pull-up resistor.

DESCRIPTION OF THE PREFERRED EMBODIMENTS

The preferred embodiments of the present invention are described below with reference to the accompanying figures, starting first with FIG. 2 showing an explanatory circuit used to highlight certain aspects of the present invention through comparison and contrast to FIG. 4.

The pad is used for signal input from and output to an external device. Port A indicates a data signal. Port E indicates an enable signal; a low (0) enable signal indicates an output mode, and a high (1) enable signal indicates an input mode. Port X is an output port for passing the pad potential (input signal) to an internal circuit when in an input mode. VDD is the source voltage, or more accurately a terminal for supplying the VDD potential, and is, for example, 3.3 V; VSS is the ground voltage, or more accurately a terminal for supplying the VSS potential, and is 0 V; and VDSUB2 is the potential of a floating N-well, or more accurately a terminal for supplying the floating N-well potential. R1 is a resistor, and L1 to L7 are logic circuits. L1, L2, L3, L5, and L7 are inverters; L6 is a NOR gate; and L4 is a NAND gate. P1 to P8 are p-channel transistors, which, except for P8, are formed over the floating N-well. N1, N2, and N4 to N8 are n-channel transistors. The gate of P1 and the drain of P5 are connected at node a; the gate of P6, the drain of P7, the drain of N7, and the drain of N8 are connected at node b. P1 and N1 are hereafter referred to as a drive circuit (driver), and P8 and N2 are hereafter referred to as a pre-driver circuit.

The function of the transistors shown in FIG. 2 is described next.

FIG. 2, description 1: P1 to P7

The seven p-channel transistors P1 to P7 are formed on a floating N-well. As a result, two opposing diodes are formed between the p-channel transistor source and drain symmetrically to VDSUB2 (the floating N-well) shown in FIG. 3.

As a result, even if a 5-V signal exceeding the source potential is applied to the drain, the current path from the drain to the source can be blocked by the diode between the VDSUB2 and source. That is, current leaks can be prevented.

FIG. 2, description 2: P2

VDSUB2 is charged to 5 V by p-channel transistor P2. P2 connects the pad and VDSUB2. P2 is also off whether 0 V or 3.3 V is applied to the pad because the P2 gate is connected to VDD. However, when 5 V is input to the pad, a potential difference of Vtp or greater occurs between the drain and gate, and P2 switches on. Note that Vtp is the threshold voltage of a p-channel transistor, and is generally approximately 0.8 V.

By thus disposing p-channel transistor P2, VDSUB2 can be charged to the same potential as the 5 V applied to the pad. If P2 is not present, VDSUB2 is charged by way of the parasitic diode of p-channel transistor P1, but only to a lower potential, that is, the input 5 V minus the threshold voltage VF of the diode.

FIG. 2, description 3: P5

P-channel transistor P5 assures the off state of p-channel transistor P1 (also referred to as a driver).

P5 connects the P1 gate and VDSUB2. Because the gate of P5 is connected to VDD when 5 V is input to the pad and the VDSUB2 goes to 5 V, P5 switches on. That is, when the gate goes to VDD, i.e., 3.3 V, and 5 V is applied to the source, the potential difference between the gate and source is greater than the transistor threshold voltage (generally approximately 0.8 V), and P5 switches on. Node a therefore goes to 5 V, and the gate of P1 can be set to 5 V.

By thus disposing P5 and thereby setting the gate of P1 to 5 V, P5 functions to switch the output driver, that is, p-channel transistor P1, of the two-way I/O circuit off.

In general in the input mode of a two-way I/O circuit, 3.3 V is applied to the gate of p-channel transistor P1 (also called a driver), 0 V is applied to the gate of n-channel transistor N1 (also called a driver), and both transistors are off. When 5 V is applied the circuit is also obviously in an input mode, and both transistors P1 and N1 must be in an off state. However, when 5 V is applied to the pad, P1 switches on because the P1 gate is at 3.3 V and the drain is 5 V. As a result, P1 does not short but a path is formed between the pad and VDD and the benefit of interrupting a current path through the diode by means of the floating N-well is lost.

By providing p-channel transistor P5 as shown in FIG. 2, however, the gate of P1 can be set to 5 V when 5 V is applied to the pad. As a result, P1 can be reliably turned off even if the drain goes to 5 V, and current leaks can be prevented.
FIG. 2, description 4: P6 and P7

P-channel transistors P6 and P7 block current leaks in the pre-driver circuit.

The P1 driver is normally controlled by an inverter (pre-driver circuit) comprising p-channel transistor P8 and n-channel transistor N2. However, by pulling node a to 5 V by means of P5 as described above, a current leakage path through the transistor is formed in pre-driver circuit p-channel transistor P8 in the same manner as in P1. The problem of how to block the current leakage path when 5 V is applied to the pad is thus simply shifted from the driver to the pre-driver circuit, that is, back one circuit. Implementing the above-described method of blocking current leakage in each and every p-channel transistor increases the transmission delay from port A to the pad, and is therefore incompatible with the need to increase operating speed.

To prevent this problem, a p-channel transistor P6 is inserted between P8 and node a, thereby shifting the path on which current leakage prevention is addressed from the transfer path between port A and the pad. In other words, it is no longer necessary to address current leakage problems caused by a 5 V input at the circuit stage before the pre-driver circuit comprising P8 and N2, that is, at the L5 inverter.

In addition, by providing for p-channel transistor P6 a p-channel transistor P7 performing the same function as P5, the pre-driver circuit (node a) current leakage path can also be blocked. That is, when 5 V is applied from an external source, P7 is turned on, similarly to P5, by the potential difference between the voltage applied to the gate and the voltage applied to the source, thereby pulling node b up to 5 V and reliably turning P6 off. As a result, the current leakage path in the pre-driver circuit is reliably blocked.
FIG. 2, description 5: N1, N2, and N4 to N7

Unstable states are reduced by n-channel transistors N1, N2, and N4 to N7.

An "unstable state" as used herein refers, for example, to a state in which node b is floating. When node b is floating, it cannot be determined whether P6 is on or off. This is an unstable state for the IC, that is, a state in which a current leakage path can easily form. This is described first with reference to the state of node b.

To assure stable IC operation, p-channel transistor P6 and node b ideally change state as follows:

a) input mode, 5 V applied: P6 is off, node b is 5 V;

b) all other modes: P6 is on, node b is 0 V.

However, the following states occur with a circuit configuration as shown in FIG. 2.

In an input mode (port E is high) with 5 V applied to the pad, P7 is on. As a result, the P6 gate potential, that is, node b, goes to 5 V, and P6 is off.

In all other modes, node b is as follows:

a) output mode (port E is low): node b is 0 V because n-channel transistor N8 is on;

b) input mode, 0 V applied: node b goes to one of the following three states depending on the input potential before 0 V was input, that is (1) if the input potential goes from 0 V→3.3 V→0 V: N4 to N7 switch on, and P7 switches off, causing node b to go to 3.3 V−4×Vtn (where Vtn is the n-channel transistor threshold voltage, generally approximately 0.7 V);

(2) if the input potential goes from 5 V→3.3 V→0 V: N8 is off and N7 remains off (as a result of the 5 V input; described more fully below), causing node b to float;

(3) if the input potential goes from 5 V→0 V: as with case (2) above, node b is floating;

c) input mode, 3.3 V applied: node b goes to one of the following two states depending on the input potential before 3.3 V was input, that is (1) if the input potential goes from 0 V→3.3 V: N8 and P7 are off, but N4 to N7 are on, causing node b to go to 3.3 V−4×Vtn (where Vtn is the n-channel transistor threshold voltage, generally approximately 0.7 V);

(2) if the input potential goes from 5 V→3.3 V: N8 is off and N7 remains off (as a result of the 5 V input; described more fully below), causing node b to float.

If the input potential before case (1) above in a 3.3 V input mode was 5 V, node b will float as in case (2) above.

A floating transistor gate potential in an IC means that it may not be possible to assure reliable operation. As a result, the I/O circuit used as an interface circuit and shown in FIG. 2 is unstable in any of three cases in which the input voltage of an input mode goes from a high potential to 0 V or 3.3 V, that is, goes from 5 V to 3.3 V, from 5 V to 0 V, or from 5 V to 3.3 V to 0 V. This instability is a result of node b floating. Operation in all other states is, however, extremely stable.

Node b being unstable means that it is not known whether P6 is on or off. Therefore, if P6 switches off when 3.3 V is input, node a is also floating. As a result, the p-channel transistor P1 (driver) may switch on, that is, a path may be completed between the pad and VDD.

A circuit comprising the four n-channel transistors N4 to N7 is therefore disposed to reduce node b instability (floating) states.

N-channel transistor N4 is connected to VDD, and the drain of N4 can therefore only be charged to a voltage that is Vtn lower than VDD (where Vtn is the n-channel transistor threshold voltage, generally approximately 0.7 V). The drain potential of the three n-channel transistors N5 to N7 can also only be charged to a voltage that is Vtn lower than each source potential because the gate of each transistor is connected to the source potential. As a result, node b goes to a potential four times Vtn lower than VDD. While this potential is not 0 V, it is low enough to function as a low potential insofar as P6 is concerned. It is therefore possible by turning all four n-channel transistors N4 to N7 on to cause P6 to switch on, and therefore fix node a to 3.3 V.

The number of transistors used to accomplish the task performed here by n-channel transistors N4 to N7 is preferably greater than or equal to two and less than or equal to four because the n-channel transistor threshold voltage is generally approximately 0.7 V. Four transistors are used in the exemplary embodiment shown in FIG. 2. This is to reliably assure that P6 is on, that is, to drive node b as close as possible to 0 V. If more than four n-channel transistors are used, the speed at which node b is driven substantially to 0 V decreases. If not enough transistors are used, it is more difficult to reliably control the P6 state, that is, node a.

In the circuit shown in FIG. 2, the gate of N4 is controlled by inverter L3, and inverter L3 is controlled by the signal from port E. Therefore, when N8 is on, N4 is off, and a short current does not flow from VDD to VSS. Even if bus contention occurs during ac operation, connection of the four transistors N4 to N7 significantly lowers transistor capacity, and a short current of only approximately 10 µA flows.

When 5 V is applied to the pad and P7 switches on, node b goes to 5 V. The three n-channel transistors N4 to N6 are on at this time, and N7 switches off because the N7 drain potential (node b) is 5 V, that is, is higher than the gate potential. As a result, a current leakage path from VDSUB2 to VDD can be blocked. This is a factor causing node b to float because N7 switches off when the input potential is 5 V, then changes to 0 V and 3.3 V. Thus, once N7 turns off, it keeps node b floating until 5 V is again input or the input mode changes to an output mode.

As described above, once n-channel transistor N7 switches off, it is not reset to an on state until node b goes to 0 V, or more specifically goes to the potential Vtn lower than the gate potential of N7. This means that the circuit comprising n-channel transistors N4 to N7 functions as follows when in an input mode. That is, a) when the input changes from 0 V to 3.3 V, node b is held low;

b) when the input changes from 5 V to 3.3 V, node b is floating.

As described above, the circuit comprising n-channel transistors N4 to N7 thus resolves one of the two conditions causing node b to be unstable.

FIG. 2, description 6: P3 and P4

P-channel transistors P3 and P4 fix VDSUB2 to 3.3 V.

In an output mode it is not necessary to consider any signal inputs, and VDSUB2 is therefore preferably fixed to the same potential as VDD. "Not necessary to consider any signal inputs" as used herein means that the pad of an I/O circuit used as an interface circuit as shown in FIG. 2 is connected to a data bus or other signal source to which various other kinds of circuits may also be connected, but only one circuit connected to this data bus or signal source can be on at any given time.

What operates to fix VDSUB2 to the same potential as VDD are p-channel transistors P3 and P4. In an output mode, the driver comprising P1 and N1 always drives either node a or the pad to 0 V. When node a is 0 V, P4 is on, and VDSUB2 is charged to VDD. When the pad is 0 V, P3 is on, and VDSUB2 is charged to VDD.

The gate of P3 receives a signal directly from the pad, and is therefore easily damaged when a static charge is applied to the pad. The pad and gate of P3 are therefore connected via a protective resistor R1, as are the pad and inverter L1 input, thereby making the gate insulator film more resistant to damage resulting from a static charge.

When 0 V is applied to the pad in an input mode, the p-channel transistor P3 also functions to charge VDSUB2 to VDD.

The potential states of the floating N-well and node b in the circuit shown in FIG. 2 in both input and output modes under various operating conditions are shown in Table 1.

TABLE 1

| Mode | I/O potential | Transition | VDSUB2 potential | Node b potential |
|---|---|---|---|---|
| Input mode | 0 V | 3.3 V->0 V | 3.3 V | floating (5->3.3->0) 3.3 V–4 × Vtn (0->3.3->0) |
|  |  | 5 V->0 V | 3.3 v | floating |

TABLE 1-continued

| Mode | I/O potential | Transition | VDSUB2 potential | Node b potential |
|---|---|---|---|---|
|  | 3.3 V | 0 V->3.3 V | floating (3.3 V–Vtp) | 3.3 V–4 × Vtn |
|  |  | 5 V->3.3 V | floating (3.3 V–Vtp) | floating |
|  | 5 V | 0 V->5 V | 5 V | 5 V |
|  |  | 3.3 V->5 V | 5 V | 5 V |
| Output mode | 0 V | 3.3 V->0 V | 3.3 V | 0 V |
|  | 3.3 V | 0 V->3.3 V | 3.3 V | 0 V |

An interface circuit according to an alternative embodiment of the present invention is described next with reference to FIG. 4. This interface circuit differs from that shown in FIG. 2 in that it provides more effective leakage current prevention. As compared with the circuit shown in FIG. 2, this interface circuit more reliably prevents current leakage when the input mode input potential is 0 V.

It should be noted that like parts in FIG. 4 and FIG. 2 are identified by like reference numerals as described below.

The pad is used for signal input from and output to an external device. Port A indicates a data signal. Port E indicates an enable signal; a low (0) enable signal indicates an output mode, and a high (1) enable signal indicates an input mode. Port X is an output port for passing the pad potential (input signal) to an internal circuit when in an input mode. VDD is the source voltage, or more accurately a terminal for supplying the VDD potential, and is, for example, as 3.3 V; VSS is the ground voltage, or more accurately a terminal for supplying the VSS potential, and is 0 V; and VDSUB2 is the potential of a floating N-well, or more accurately a terminal for supplying the floating N-well potential. R1 is a resistor, and L1 to L7 are logic circuits. L1, L2, L5, and L7 are inverters; L3 and L6 are NOR gates; and L4 is a NAND gate. P1 to P8 are p-channel transistors, which, except for P8, are formed over the floating N-well. N1 to N8 are n-channel transistors. The gate of P1 and the drain of P5 are connected at node a; the gate of P6, the drain of P7, the drain of N3, the drain of N7, and the drain of N8 are connected at node b. P1 and N1 are hereafter referred to as a drive circuit (driver), and P8 and N2 are hereafter referred to as a pre-driver circuit.

It will thus be evident that the differences between the circuits shown in FIG. 2 and FIG. 4 is the presence of n-channel transistor N3 and L3 is now a NOR gate with one of its inputs connected to the output of inverter L1.

The function of the transistors shown in FIG. 4 is described next.

FIG. 4, description 1: P1 to P7

The seven p-channel transistors P1 to P7 are formed on a floating N-well. As a result, two opposing diodes are formed between the p-channel transistor source and drain symmetrically to VDSUB2 (the floating N-well) shown in FIG. 3.

As a result, even if a 5-V signal exceeding the source potential is applied to the drain, the current path from the drain to the source can be blocked by the diode between the VDSUB2 and source. That is, current leaks can be prevented.

FIG. 4, description 2: P2

VDSUB2 is charged to 5 V by p-channel transistor P2.

P2 connects the pad and VDSUB2. P2 is also off whether 0 V or 3.3 V is applied to the pad because the P2 gate is connected to VDD. However, when 5 V is input to the pad, a potential difference of Vtp or greater occurs between the drain and gate, and P2 switches on. Note that Vtp is the threshold voltage of a p-channel transistor, and is generally approximately 0.8 V.

By thus disposing p-channel transistor P2, VDSUB2 can be charged to the same potential as the 5 V applied to the pad. If P2 is not present, VDSUB2 is charged by way of the parasitic diode of p-channel transistor P1, but only to a lower potential, that is, the input 5 V minus the threshold voltage VF of the diode.

FIG. 4, description 3: P5

P-channel transistor P5 assures the off state of p-channel transistor P1 (also referred to as a driver).

P5 connects the P1 gate and VDSUB2. Because the gate of P5 is connected to VDD when 5 V is input to the pad and the VDSUB2 goes to 5 V, P5 switches on. That is, when the gate goes to VDD, i.e., 3.3 V, and 5 V is applied to the source, the potential difference between the gate and source is greater than the transistor threshold voltage (generally approximately 0.8 V), and P5 switches on. Node a therefore goes to 5 V, and the gate of P1 can be set to 5 V.

By thus disposing P5 and thereby setting the gate of P1 to 5 V, P5 functions to switch the output driver, that is, p-channel transistor P1, of the two-way I/O circuit off.

In general, in the input mode of a two-way I/O circuit, 3.3 V is applied to the gate of p-channel transistor P1 (also called a driver), 0 V is applied to the gate of n-channel transistor N1 (also called a driver), and both transistors are off. When 5 V is applied the circuit is also in an input mode, and both transistors P1 and N1 must be in an off state. However, when 5 V is applied to the pad, P1 switches on because the P1 gate is at 3.3 V and the drain is 5 V. As a result, P1 does not short but a path is formed between the pad and VDD and the benefit of interrupting a current path through the diode by means of the floating N-well is lost.

By providing p-channel transistor P5 as shown in FIG. 4, however, the gate of P1 can be set to 5 V when 5 V is applied to the pad. As a result, P1 can be reliably turned off even if the drain goes to 5 V, and current leaks can be prevented.

FIG. 4 description 4: P6 and P7

P-channel transistors P6 and P7 block current leaks in the pre-driver circuit.

The P1 driver is normally controlled by an inverter (pre-driver circuit) comprising p-channel transistor P8 and n-channel transistor N2. However, by pulling node a to 5 V by means of P5 as described above, a current leakage path through the transistor is formed in pre-driver circuit p-channel transistor P8 in the same manner as in P1. The problem of how to block the current leakage path when 5 V is applied to the pad is thus simply shifted from the driver to the pre-driver circuit, that is, back one circuit. Implementing the above-described method of blocking current leakage in each and every p-channel transistor increases the transmission delay from port A to the pad, and is therefore incompatible with the need to increase operating speed.

To prevent this problem, a p-channel transistor P6 is inserted between P8 and node a, thereby shifting the path on which current leakage prevention is addressed from the transfer path between port A and the pad. In other words, it is no longer necessary to address current leakage problems caused by a 5 V input at the circuit stage before the pre-driver circuit comprising P8 and N2, that is, at the L5 inverter.

In addition, by providing for p-channel transistor P6 a p-channel transistor P7 performing the same function as P5, the pre-driver circuit (node a) current leakage path can also be blocked. That is, when 5 V is applied from an external source, P7 is turned on, similarly to P5, by the potential difference between the voltage applied to the gate and the voltage applied to the source, thereby pulling node b up to 5 V and reliably turning P6 off. As a result, the current leakage path in the pre-driver circuit is reliably blocked.

FIG. 4, description 5: N1 to N7

Unstable states are reduced by n-channel transistors N1 to N7.

An "unstable state" as used herein refers, for example, to a state in which node b is floating. When node b is floating, it cannot be determined whether P6 is on or off. This is an unstable state for the IC, that is, a state in which a current leakage path can easily form. This is described first with reference to the state of node b.

To assure stable IC operation, p-channel transistor P6 and node b ideally change state as follows:

a) input mode, 5 V applied: P6 is off, node b is 5 V;

b) all other modes: P6 is on, node b is 0 V.

However, the following states occur with a circuit configuration as shown in FIG. 4.

In an input mode (port E is high) with 5 V applied to the pad, P7 is on. As a result, the P6 gate potential, that is, node b, goes to 5 V, and P6 is off.

In all other modes, node b is as follows:

a) output mode (port E is low): node b is 0 V because n-channel transistor N8 is on;

b) input mode, 0 V applied: node b goes to 0 V because n-channel transistor N3 turns on (note that the node b state in this input case is a feature differentiating the circuit shown in FIG. 4 from that in FIG. 2);

c) input mode, 3.3 V applied: node b is floating because N3, N8, and P7 are off.

A floating transistor gate potential in an IC means that it may not be possible to assure reliable operation. As a result, the I/O circuit used as an interface circuit and shown in FIG. 4 is unstable when the input mode input voltage is 3.3 V. This instability is a result of node b floating. Operation in all other states is, however, extremely stable, even compared with the device shown in FIG. 2. This is because the presence of n-channel transistor N3 enables the device shown in FIG. 4 to operate more stably than the device shown in FIG. 2.

Node b being unstable means that it is not known whether P6 is on or off. Therefore, if P6 switches off when 3.3 V is input, node a is also floating. As a result, the p-channel transistor P1 (driver) may switch on, that is, a path may be completed between the pad and VDD.

Completion of a path between the pad and VDD in this case, however, is considered to cause less of a problem when the device shown in FIG. 4 is actually used in an IC than when the device shown in FIG. 2 is used. This is because when this path is formed in the FIG. 4 device, the potential of both the pad and VDD is the same 3.3 V. That is, P1 becomes unstable due to a floating node when the difference between VDD of the IC (3.3 V in this case) and VDD from an external source (also 3.3 V in this case) is substantially the electromotive force (emf), but in this case this difference is essentially zero and current leakage is unlikely. On the other hand, this is also obviously not a desirable condition for an IC.

A circuit comprising the four n-channel transistors N4 to N7 is therefore disposed to reduce node b instability (floating) states.

N-channel transistor N4 is connected to VDD, and the drain of N4 can therefore only be charged to a voltage that is Vtn lower than VDD (where Vtn is the n-channel transistor threshold voltage, generally approximately 0.7 V). The drain potential of the three n-channel transistors N5 to N7 can also only be charged to a voltage that is Vtn lower than each source potential because the gate of each transistor is connected to the source potential. As a result, node b goes to a potential four times Vtn lower than VDD. While this potential is not 0 V, it is low enough to function as a low potential insofar as P6 is concerned. It is therefore possible by turning all four n-channel transistors N4 to N7 on to cause P6 to switch on, and therefore fix node a to 3.3 V.

The number of transistors used to accomplish the task performed here by n-channel transistors N4 to N7 is preferably greater than or equal to two and less than or equal to four because the n-channel transistor threshold voltage is generally approximately 0.7 V. Four transistors are used in the exemplary embodiment shown in FIG. 4. This is to reliably assure that P6 is on, that is, to drive node b as close as possible to 0 V. If more than four n-channel transistors are used, the speed at which node b is driven substantially to 0 V decreases. If not enough transistors are used, it is more difficult to reliably control the P6 state, that is, node a.

In the circuit shown in FIG. 4, the gate of N4 is controlled by NOR gate L3, and L3 is controlled by signals from port E and the pad. Therefore, when N3 or N8 is on, N4 is off, and a short current does not flow from VDD to VSS. Even if bus contention occurs during ac operation, connection of the four transistors N4 to N7 significantly lowers transistor capacity, and a short current of only approximately 10 μA flows.

When 5 V is applied to the pad and P7 switches on, node b goes to 5 V. The three n-channel transistors N4 to N6 are on at this time, and N7 switches off because the N7 drain potential (node b) is 5 V, that is, is higher than the gate potential. As a result, a current leakage path from VDSUB2 to VDD can be blocked. This is a factor causing node b to float because N7 switches off when the input potential is 5 V and then changes to 3.3 V. Thus, once N7 turns off, it keeps node b floating until 0 V is input, 5 V is again input, or the input mode changes to an output mode. In this respect, the device shown in FIG. 4 is more effective than that shown in FIG. 2. More specifically, while the circuit shown in FIG. 4 can set node b to VSS (0 V) with an input potential of 0 V regardless of what the previous input potential was, if the previous input potential was 5 V in the circuit shown in FIG. 2, node b remains floating even when the input potential goes to 0 V.

As described above, once n-channel transistor N7 switches off, it is not reset to an on state until node b goes to 0 V, or more specifically goes to the potential Vtn lower than the gate potential of N7. This means that the circuit comprising n-channel transistors N4 to N7 functions as follows when in an input mode. That is, a) when the input changes from 0 V to 3.3 V, node b is held low;

b) when the input changes from 5 V to 3.3 V, node b is floating.

As described above, the circuit comprising n-channel transistors N4 to N7 thus resolves one of the two conditions causing node b to be unstable.

FIG. 4, description 6: P3 and P4

P-channel transistors P3 and P4 fix VDSUB2 to 3.3 V.

In an output mode it is not necessary to consider any signal inputs, and VDSUB2 is therefore preferably fixed to the same potential as VDD. "Not necessary to consider any signal inputs" as used herein means that the pad of an I/O circuit used as an interface circuit as shown in FIG. 4 is connected to a data bus or other signal source to which various other kinds of circuits may also be connected, but only one circuit connected to this data bus or signal source can be on at any given time.

What operates to fix VDSUB2 to the same potential as VDD are p-channel transistors P3 and P4. In an output mode, the driver comprising P1 and N1 always drives either node a or the pad to 0 V. When node a is 0 V, P4 is on, and VDSUB2 is charged to VDD. When the pad is 0 V, P3 is on, and VDSUB2 is charged to VDD.

The gate of P3 receives a signal directly from the pad, and is therefore easily damaged when a static charge is applied to the pad. The pad and gate of P3 are therefore connected via a protective resistor R1, as are the pad and inverter L1 input, thereby making the gate insulator film more resistant to damage resulting from a static charge.

When 0 V is applied to the pad in an input mode, the p-channel transistor P3 also functions to charge VDSUB2 to VDD.

It is therefore possible to achieve by means of a circuit as shown in FIG. 4 an interface circuit such as a two-way input/output circuit which can output 3.3 V, with which no problems occur when a 5-V input is applied, and which is also effectively free of current leakage problems.

The potential states of the floating N-well and node b in the circuit shown in FIG. 4 in both input and output modes under various operating conditions are shown in Table 2.

TABLE 2

| Mode | I/O potential | Transition | VDSUB2 potential | Node b potential |
|---|---|---|---|---|
| Input mode | 0 V | 3.3 V->0 V | 3.3 V | 0 V |
|  |  | 5 V->0 V | 3.3 V | 0 V |
|  | 3.3 V | 0 V->3.3 V | floating (3.3 V–VF) | 3.3 V–4 × Vtn |
|  |  | 5 V->3.3 V | floating (3.3 V–VF) | floating |
|  | 5 V | 0 V->5 V | 5 V | 5 V |
|  |  | 3.3 V->5 V | 5 V | 5 V |
| Output mode | 0 V | 3.3 V->0 V | 3.3 V | 0 V |
|  | 3.3 V | 0 V->3.3 V | 3.3 V | 0 V |

An interface circuit according to a further alternative embodiment of the present invention is described next with reference to FIG. 5. The interface circuit shown in FIG. 5 adds one transistor P11 to the circuit shown in FIG. 4, and thereby eliminates a floating VDSUB2 state that can occur under particular conditions with the circuit shown in FIG. 4. This interface circuit is otherwise identical in features and performance to that shown in FIG. 4.

It should be noted that like parts in FIG. 5 and FIG. 4 are identified by like reference numerals as described below.

The pad is used for signal input from and output to an external device. Port A indicates a data signal. Port E indicates an enable signal; a low (0) enable signal indicates an output mode, and a high (1) enable signal indicates an input mode. Port X is an output port for passing the pad potential (input signal) to an internal circuit when in an input mode. VDD is the source voltage, or more accurately a terminal for supplying the VDD potential, and is, for example, 3.3 V; VSS is the ground voltage, or more accurately a terminal for supplying the VSS potential, and is 0 V; and VDSUB2 is the potential of a floating N-well, or more accurately a terminal for supplying the floating N-well potential. R1 is a resistor, and L1 to L7 are logic circuits. L1, L2, L5, and L7 are inverters; L3 and L6 are NOR gates; and L4 is a NAND gate. P1 to P8 and P11 are p-channel transistors, which, except for P8, are formed over the floating N-well. N1 to N8 are n-channel transistors. The gate of P1 and the drain of P5 are connected at node a; the gate of P6, the drain of P7, the drain of N3, the drain of N7, the drain of N8, and the gate of P11 are connected at node b. P1 and N1 are hereafter referred to as a drive circuit (driver), and P8 and N2 are hereafter referred to as a pre-driver circuit.

It will thus be evident that the difference between the circuits shown in FIG. 5 and FIG. 4 is the presence of p-channel transistor P11.

FIG. 5, description 1: P11

Except for p-channel transistor P11, transistor functions in the circuit shown in FIG. 5 are the same as those shown in FIG. 4 and described above. Only the function of p-channel transistor P11 is therefore described below. Refer to the above description of FIG. 4 for the function of all other transistors.

As summarized in Table 2, the I/O circuit (interface circuit) shown in FIG. 4 behaves as follows when the input signal potential in an input mode is 3.3 V. That is, a) if an input mode is enabled, the input signal potential is 3.3 V, and the previous input signal potential was 0 V, then
1) VDSUB2 is floating (3.3 V−VF), and
2) node b is at 3.3 V−(4×Vtn);

b) if an input mode is enabled, the input signal potential is 3.3 V, and the previous input signal potential was 5 V, then
1) VDSUB2 is floating (3.3 V−VF), and
2) node b is also floating.

P-channel transistor P11 is formed over the floating N-well with the gate thereof connected to node b, the source to VDD, and the drain to VDSUB2. The function of p-channel transistor P11 is similar to p-channel transistors P3 and P4, that is, to fix VDSUB2 to VDD.

With the I/O circuit shown in FIG. 5, the potential of node b is 0 V when the input mode is enabled and the input signal potential is 0 V, regardless of the previous input potential. This is the same as with the I/O circuit shown in FIG. 4. Therefore, when the input potential is 3.3 V as described above, the potential of node b is 3.3 V−(4×Vtn) if the previous input signal potential was 0 V, and is therefore sufficient to turn the p-channel transistors on. As a result, p-channel transistor P11 can fix VDSUB2 to VDD, that is, 3.3 V, when the input signal potential of an input mode is 3.3 V and the previous input potential was 0 V.

It will therefore be evident that the I/O circuit shown in FIG. 5 is capable of further reducing floating states in an IC when compared with the I/O circuit shown in FIG. 4.

The potential states of the floating N-well and node b in the circuit shown in FIG. 5 in both input and output modes under various operating conditions are shown in Table 3.

TABLE 3

| Mode | I/O potential | Transition | VDSUB2 potential | Node b potential |
| --- | --- | --- | --- | --- |
| Input mode | 0 V | 3.3 V−>0 V | 3.3 V | 0 V |
| | | 5 V−>0 V | 3.3 V | 0 V |
| | 3.3 V | 0 V−>3.3 V | 3.3 V | 3.3 V−4 × Vtn |
| | | 5 V −>3.3 V | floating (3.3 V−VF) | floating |
| | 5 V | 0 V−>5 V | 5 V | 5 V |
| | | 3.3 V−>5 V | 5 V | 5 V |
| Output mode | 0 V | 3.3 V−>0 V | 3.3 V | 0 V |
| | 3.3 V | 0 V−>3.3 V | 3.3 V | 0 V |

An interface circuit according to a further alternative embodiment of the present invention is described next with reference to FIG. 6. The interface circuit shown in FIG. 6 is an interface circuit comprising an I/O circuit having a pull-up resistance. This interface circuit adds a pull-up resistance to the circuit shown in FIG. 4, and thereby eliminates a floating VDSUB2 state that can occur under particular conditions with the circuit shown in FIG. 4. This interface circuit is otherwise identical in features and performance to that shown in FIG. 4.

It should be noted that like parts in FIG. 6 and FIG. 4 are identified by like reference numerals as described below.

The pad is used for signal input from and output to an external device. Port A indicates a data signal. Port E indicates an enable signal; a low (0) enable signal indicates an output mode, and a high (1) enable signal indicates an input mode. Port X is an output port for passing the pad potential (input signal) to an internal circuit when in an input mode. VDD is the source voltage, or more accurately a terminal for supplying the VDD potential, and is, for example, 3.3 V; VSS is the ground voltage, or more accurately a terminal for supplying the VSS potential, and is 0 V; and VDSUB2 is the potential of a floating N-well, or more accurately a terminal for supplying the floating N-well potential. R1 is a resistor, and L1 to L7 are logic circuits. L1, L2, L5, and L7 are inverters; L3 and L6 are NOR gates; and L4 is a NAND gate. P1 to P10 are p-channel transistors, which, except for P8, are formed over the floating N-well. N1 to N12 are n-channel transistors. The gate of P1 and the drain of P5 are connected at node a; the gate of P6, the drain of P7, the drain of N3, the drain of N7, the drain of N8, and the gate of P10 are connected at node b. P1 and N1 are hereafter referred to as a drive circuit (driver), and P8 and N2 are hereafter referred to as a pre-driver circuit.

It will thus be evident that the difference between the circuits shown in FIG. 6 and FIG. 4 is the presence of p-channel transistors P9 and P10, and the presence of n-channel transistors N9 to N12.

It is generally more difficult to achieve a voltage tolerant interface circuit or I/O circuit with a pull-up resistance than it is to achieve a voltage tolerant interface circuit or I/O circuit with p-channel transistors. That is, it is generally more difficult to achieve a circuit such as shown in FIG. 6 than it is to achieve a circuit such as shown in FIG. 2, FIG. 4, or FIG. 5.

This is because while the p-channel transistor used as a driver is normally off in an input mode, the pull-up resistance must be ready for the next state. That is, a) when the input potential is 0 V to 3.3 V, the pull-up resistance circuit should be on, and b) when the input potential is 3.3 V to 5 V, the pull-up resistance circuit should be off.

The interface circuit comprising an I/O circuit as a voltage tolerant circuit shown in FIG. 6 provides this solution.

Note that except for p-channel transistors P9 and P10, and n-channel transistors N9 to N12, transistor functions in the device shown in FIG. 6 are identical to those shown in FIG. 4 and described above. Therefore, only the functions of p-channel transistors P9 and P10, and n-channel transistors N9 to N12, are described below. Refer to the above description of FIG. 4 for the function of all other transistors.

FIG. 6, description 1: P9 and P10

P-channel transistors P9 and P10 are formed on a floating N-well.

Both p-channel transistor P9 for pull-up resistance, and p-channel transistor P10 for current leakage path blocking, are formed on a floating N-well. As a result, even if the p-channel transistor drain is directly connected to the pad, a current leakage path through the diode can be blocked.

As with a common pull-up resistor, p-channel transistor P9 is controlled by the output from pre-driver circuit L6 to be off in an output mode and on in an input mode.

While P9 is on in an input mode, p-channel transistor P10 is disposed between VDD and P9 to prevent a short current between the pad and VDD when 5 V is applied. In other words, when the input potential is 5 V and an input mode is enabled, node b goes to 5 V. Because the gate of p-channel transistor P10 is connected to node b, p-channel transistor P10 turns off when a 5-V input is applied. As a result, a short current between the pad and VDD can be reliably prevented.
FIG. 6, description 2: N9 to N12

N-channel transistors N9 to N12 assure a small current leakage path.

P10 must be on unless a 5-V input signal is applied. As shown in Table 2, however, node b is floating when the input changes from 5 V to 3.3 V with a circuit as shown in FIG. 4.

This means that during actual IC operation, the pull-up resistance circuit will not turn on when the input potential changes from 5 V to an ac input. This state then continues until the pad potential drops below the logic level of input inverter L1 due, for example, to current leakage, and the n-channel transistor N3 turns on.

The four n-channel transistors N9 to N12 were added as shown in FIG. 6 to solve this problem.

The gate of n-channel transistor N12 is connected to VDD, and N12 is therefore normally on. The gates of the three n-channel transistors N9 to N11 are connected to their respective sources, and the three transistors can therefore pull down the potential of node b to a high potential, that is, Vtn×3 (where Vtn is generally approximately 0.7 V), though not to 0. This potential can cause p-channel transistor P10 to turn on. More specifically, the potential of node b is 3×Vtn (approximately 2.1 V), and if this potential is lower than VDD−Vtp, or approximately 2.5 V (3.3−0.8), p-channel transistor P10 can be turned on. This can be expressed by the following equation:

node $b$ potential=0+3×$Vtn$<VDD−1×$Vtp$.

P-channel transistor P10 can be turned on in accordance with the above equation. In the case of the circuit shown in FIG. 6, the node b potential in this case is approximately 2.1 V as described above. This is less than VDD−Vtp, or approximately 2.5 V, and p-channel transistor P10 can therefore be turned on.

It is therefore possible to prevent node b from floating when the input potential changes from 5 V to 3.3 V in an input mode, and the pull-up resistance can be turned on.

It should be noted that node b can be driven closer to 0 V by reducing the number of n-channel transistors used for n-channel transistors N9 to N12. Reducing this number of n-channel transistors can more reliably assure that p-channel transistor P10 turns on.

However, because n-channel transistors N9 to N12 are present and on when a 5-V input is applied, a short current flows, by way of p-channel transistor P7, from VDSUB2 through node b to VSS. What charges VDSUB2 at this time is the 5-V signal input to the pad, and this charge current thus becomes the input current leak.

A plurality of n-channel transistors such as N9 to N12 is needed to minimize this input current leak. However, as this number of n-channel transistors increases, for example from four to five, six, or more, the node b potential rises even if the threshold voltage of each transistor is reduced. As a result, it becomes no longer possible to assure that p-channel transistor P10 is on when the input signal changes from 5 V to 3.3 V.

The voltage tolerant I/O circuit shown in FIG. 6 uses four n-channel transistors based on an assumed input current leakage rating of several $\mu$A.

It should be noted that this input current leak through n-channel transistors N9 to N12 occurs only when an input mode is enabled and a 5-V input signal is applied, and does not occur in other operating modes or conditions.

It will therefore be apparent that compared with the circuit shown in FIG. 4, the I/O circuit shown in FIG. 6 has the ability to eliminate node b floating states when an input mode is enabled and a 3.3 V input potential is applied.

An I/O circuit as shown in FIG. 6 according to the present invention can thus output 3.3 V, is not subject to problems resulting from a 5-V input, and prevents node b from floating regardless of the operating mode and conditions. It is therefore possible to achieve by means of the circuit shown in FIG. 6 a two-way I/O circuit or other type of interface circuit that has a pull-up resistance and is free of current leakage problems.

The potential states of the floating N-well and node b in the circuit shown in FIG. 6 in both input and output modes under various operating conditions are shown in Table 4.

TABLE 4

| Mode | I/O potential | Transition | VDSUB2 potential | Node b potential |
|---|---|---|---|---|
| Input mode | 0 V | 3.3 V−>0 V | 3.3 V | 0 V |
|  |  | 5 V−>0 V | 3.3 V | 0 V |
|  | 3.3 V | 0 V−>3.3 V | floating (3.3 V−VF) | 3.3 V−4 × Vtn |
|  |  | 5 V−>3.3 V | floating (3.3 V−VF) | 0 V + 3 × Vtn |
|  | 5 V | 0 V−>5 V | 5 V | 5 V |
|  |  | 3.3 V−>5 V | 5 V | 5 V |
| Output mode | 0 V | 3.3 V−>0 V | 3.3 V | 0 V |
|  | 3.3 V | 0 V−>3.3 V | 3.3 V | 0 V |

As will be apparent from the above description, a voltage tolerant two-way input/output circuit or other interface circuit to which a potential exceeding the internal supply potential of the interface circuit can be applied from an external device is, according to the present invention, capable of outputting 3.3 V, reliably even when 5 V is input, and in effect free of current leakage problems because a node b can in effect be prevented from floating under all operating modes and conditions.

In addition, a voltage tolerant two-way input/output circuit or other interface circuit having a pull-up resistance according to the present invention is also capable of outputting 3.3 V, reliably even when 5 V is input, and free of current leakage problems because a node b can be prevented from floating under all operating modes and conditions.

Although the present invention has been described in connection with the preferred embodiments thereof with reference to the accompanying drawings, it is to be noted that various changes and modifications will be apparent to those skilled in the art. Such changes and modifications are to be understood as included within the scope of the present invention as defined by the appended claims.

What is claimed is:

1. A interface circuit comprising:
   a terminal that supplies a first power source (Vdd) having a first potential;
   a terminal that supplies a second power source (Vss) having a second potential lower than the first potential;
   a first driver circuit (P8, N2) that receives a data signal input;
   a second driver circuit (P1, N1) and a first node (node a) connecting an output from the first driver circuit to an input of the second driver circuit;

an input/output pad connected to an output of the second driver circuit;

a second node (node b) connected between the terminal for supplying the first power source and the terminal for supplying the second power source; and a first protection circuit (N3) that controls a state of the first driver circuit (P8, N2) by setting the second node (node b) to the second potential when a potential substantially equal to the second power source (Vss) is applied to the input/output pad from an external source.

2. The interface circuit as set forth in claim 1, wherein the first protection circuit comprises a first n-channel transistor (N3) having a gate electrically connected to the input/output pad, a source connected to the terminal supplying the second power source, and a drain connected through the second node to the terminal supplying the first power source.

3. An interface circuit comprising:

a terminal that supplies a first power source (Vdd) having a first potential;

a terminal that supplies a second power source (Vss) having a second potential lower than the first potential;

a first driver circuit (P8, N2) that receives a data signal input and includes a first p-channel transistor (P8) and a second n-channel transistor (N2);

a second driver circuit (P1, N1) and a first node (node a) connecting an output from the first driver circuit to an input of the second driver circuit; said second driver circuit including a second p-channel transistor (P1) and a third n-channel transistor (N1);

an input/output pad connected to an output of the second driver circuit;

a second node (node b) connected between the terminal for supplying the first power source and the terminal for supplying the second power source; and a first protection circuit (N3) that controls a state of the first driver circuit (P8, N2) by setting the second node (node b) to the second potential when a potential substantially equal to the second power source (Vss) is applied to the input/output pad from an external source; wherein said first protection circuit includes a first n-channel transistor (N3) having a gate electrically connected to the input/output pad, a source connected to the terminal supplying the second power source, and a drain connected through the second node to the terminal supplying the first power source;

a second protection circuit (P2, P5) comprising a third p-channel transistor (P2) that charges the potential of a floating N-well to a potential higher than the first potential, and a fourth p-channel transistor (P5) that sets the second p-channel transistor to an off state when a potential higher than the first potential of the first power source is applied to the input/output pad from an external source; and a third protection circuit (P2, P6, P7) comprising
a fifth p-channel transistor (P6) disposed between the first p-channel transistor and the first node, with a gate of the first p-channel transistor connected to the second node,
the third p-channel transistor, and
a sixth p-channel transistor (P7) that sets the fifth p-channel transistor to an off state in response to a potential higher than the first potential of the first power source being applied to the input/output pad from an external source.

4. The interface circuit as set forth in claim 3, wherein the second p-channel transistor, third p-channel transistor, fourth p-channel transistor, fifth p-channel transistor, and sixth p-channel transistor are on the floating N-well.

5. The interface circuit as set forth in claim 3, further comprising a group of n-channel transistors (N4, N5, N6, N7) connected in series between the terminal supplying the first power source (Vdd) and the second node, and a first member (if said group having a gate that receives a potential applied to the input/output pad from an external source.

6. The interface circuit as set forth in claim 5, wherein the number of transistors in the group of n-channel transistors is greater than or equal to two and less than or equal to four.

7. The interface circuit as set forth in claim 5, wherein the group of n-channel transistors sets the fifth p-channel transistor to an off state, and fixes the first node to the first potential of the first power source, according to the potential applied to the input/output pad from an external source, by setting the potential of the second node to the first potential of first power source minus the combined total threshold voltage of the transistors forming the group of n-channel transistors.

8. The interface circuit as set forth in claim 3, further comprising an eighth p-channel transistor (P9) and a ninth p-channel transistor (P10) in series between the input/output pad and the terminal supplying first power source, and wherein
both the eighth p-channel transistor and the ninth p-channel transistor are formed on the floating N-well,
a gate of the eighth p-channel transistor is connected to a gate of the third n-channel transistor (N1), and
a gate of the ninth p-channel transistor is connected to the second node.

9. An interface circuit comprising:

a terminal that supplies a first power source (Vdd) having a first potential;

a terminal that supplies a second power source (Vss) having a second potential lower than the first potential;

a first driver circuit (P8, N2) that receives a data signal input;

a second driver circuit (P1, N1) and a first node (node a) connecting an output from the first driver circuit to an input of the second driver circuit;

an input/output pad connected to an output of the second driver circuit;

a second node (node b) connected between the terminal for supplying the first power source and the terminal for supplying the second power source;

a first protection circuit (N3) that controls a state of the first driver circuit (P8, N2) by setting the second node (node b) to the second potential when a potential substantially equal to the second power source (Vss) is applied to the input/output pad from an external source; and a seventh p-channel transistor (P11), said seventh p-channel transistor formed on a floating N-well between the terminal supplying the first power source and a terminal supplying the potential of the floating N-well, said seventh p-channel transistor having a gate connected to the second node.

* * * * *

UNITED STATES PATENT AND TRADEMARK OFFICE
CERTIFICATE OF CORRECTION

PATENT NO.     : 6,323,684 B1
DATED          : November 27, 2001
INVENTOR(S)    : Masayuki Oshima It is certified that error appears in the above-identified patent and that said Letters Patent is hereby corrected as shown below:

<u>Column 18,</u>
Line 9, after "member" delete "(" and change "if" to -- of --

Signed and Sealed this

Twenty-third Day of April, 2002

Attest:

Attesting Officer

JAMES E. ROGAN
Director of the United States Patent and Trademark Office